US006967416B2

(12) United States Patent
Clevenger et al.

(10) Patent No.: US 6,967,416 B2
(45) Date of Patent: Nov. 22, 2005

(54) SHARED ON-CHIP DECOUPLING CAPACITOR AND HEAT-SINK DEVICES

(75) Inventors: Lawrence A. Clevenger, LaGrangeville, NY (US); Amy R. Hsu, Fishkill, NY (US); Louis L. Hsu, Fishkill, NY (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 482 days.

(21) Appl. No.: 10/193,641

(22) Filed: Jul. 11, 2002

(65) Prior Publication Data

US 2004/0007918 A1 Jan. 15, 2004

(51) Int. Cl.[7] .............................................. H01H 35/00
(52) U.S. Cl. ........................ 307/117; 307/112; 307/116
(58) Field of Search ........................ 307/112, 116, 117, 307/109; 361/93.8, 103, 106

(56) References Cited

U.S. PATENT DOCUMENTS 5,103,283 A * 4/1992 Hite ........................... 257/724
5,568,423 A * 10/1996 Jou et al. ............... 365/185.33
5,694,297 A * 12/1997 Smith et al. ................ 361/785
6,115,270 A * 9/2000 Yamane et al. ............... 363/40
6,424,058 B1 * 7/2002 Frech et al. ................ 307/109
2001/0050408 A1 * 12/2001 Bernstein et al.

* cited by examiner

*Primary Examiner*—Robert L. Deberadinis

(74) *Attorney, Agent, or Firm*—McGinn & Gibb, PLLC; Marian Underweiser

(57) ABSTRACT

A method and structure for an integrated chip structure comprises a substrate having a power supply, a chip attached to the substrate, at least two decoupling capacitors attached to the chip and to the power supply, and a control circuit adapted to select physical locations of active decoupling capacitors to be interspersed with inactive decoupling capacitors. The invention selectively connects and disconnects the decoupling capacitors to and from the power supply, such that the inactive decoupling capacitors provide a uniform heat dissipation function across the chip and the active decoupling capacitors provide a uniform power regulation function across the chip.

36 Claims, 6 Drawing Sheets

Fig-1,
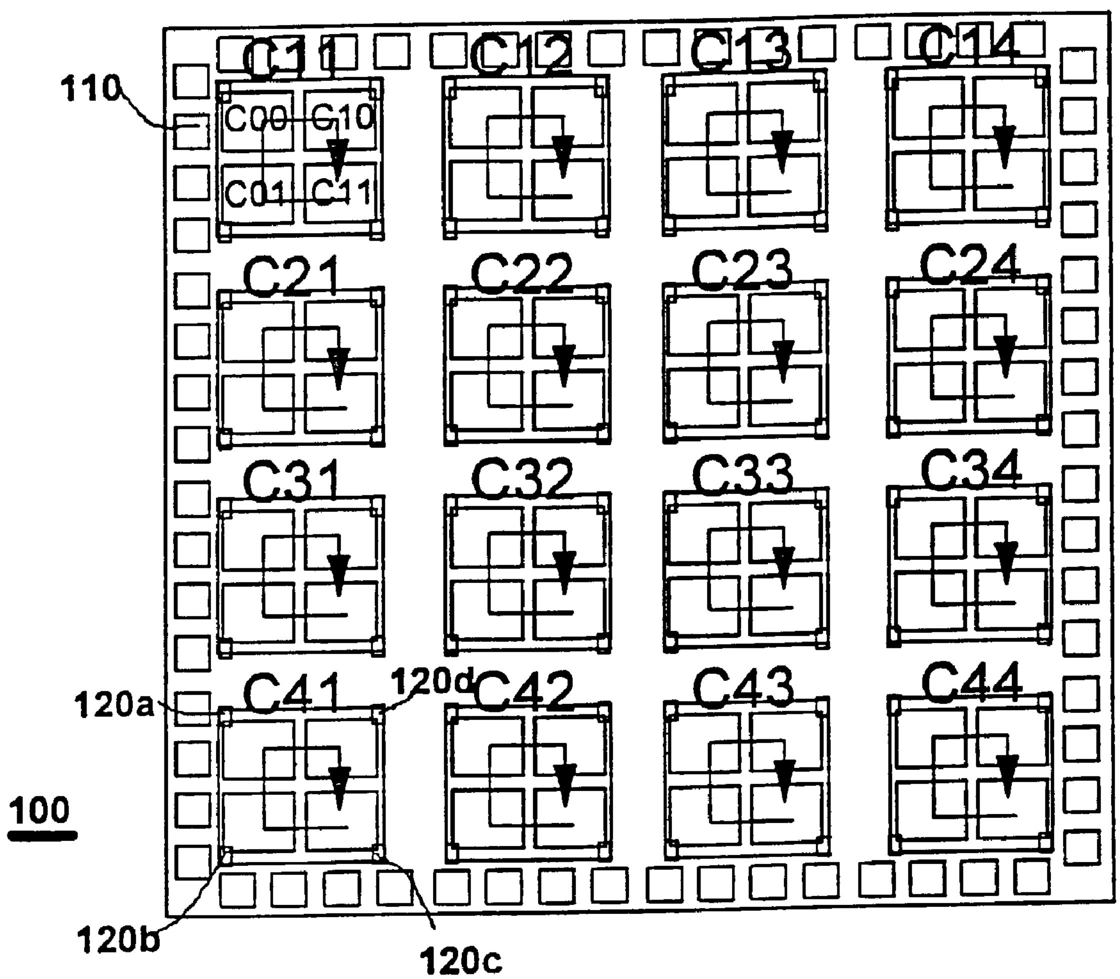

Fig-2,
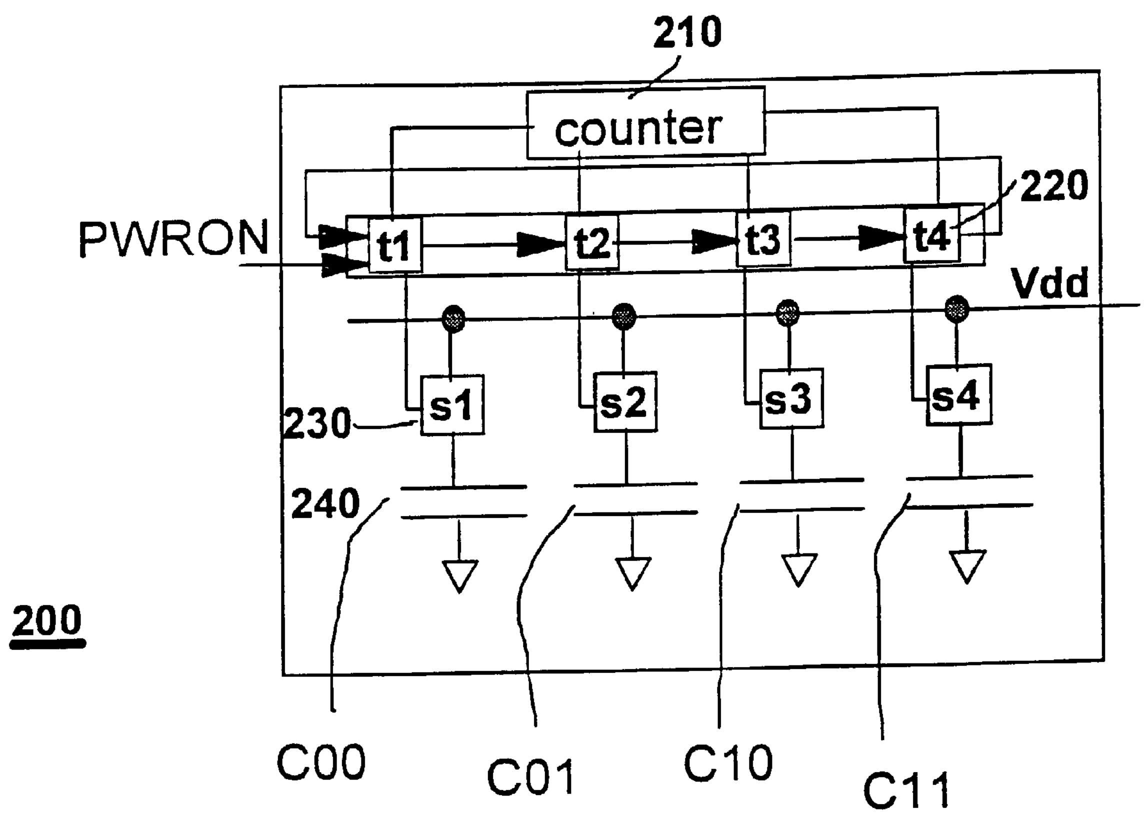

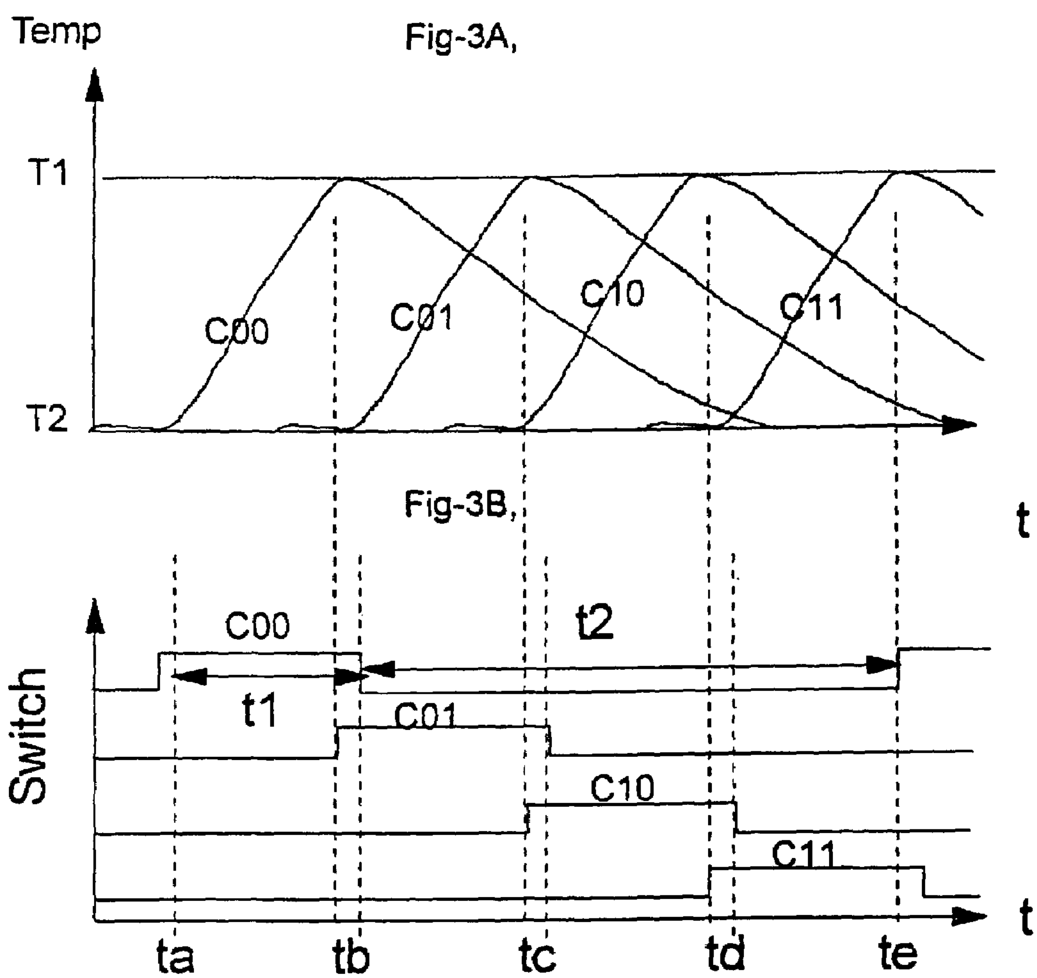
Temp
Fig-3A,
T1
T2
C00
C01
C10
C11
Fig-3B,
t
Switch
C00
t2
t1
C01
C10
C11
t
ta
tb
tc
td
te Fig-4A,
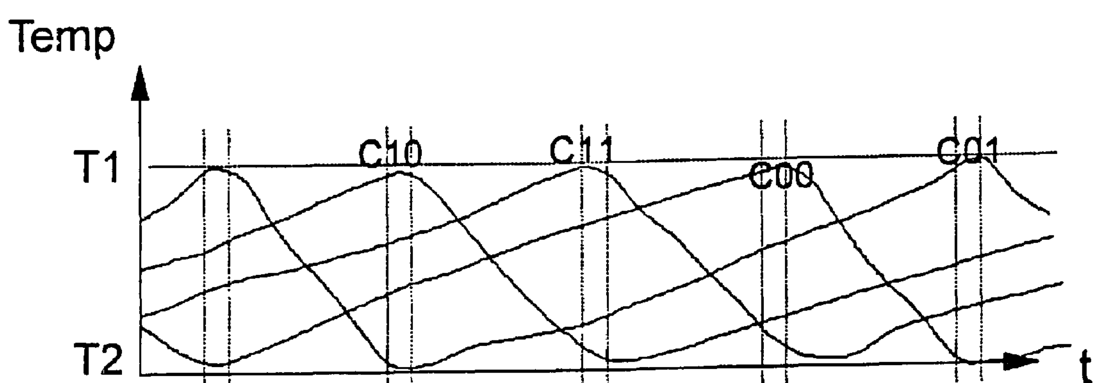
Fig-4B,
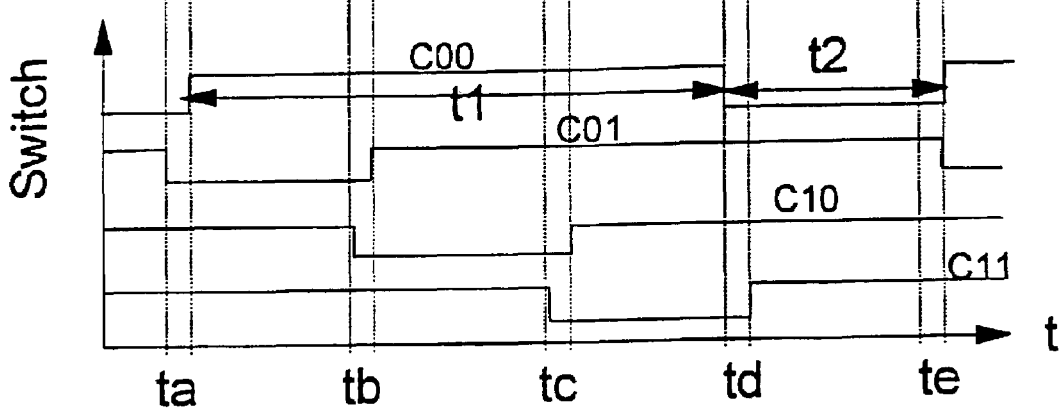

Fig-5,
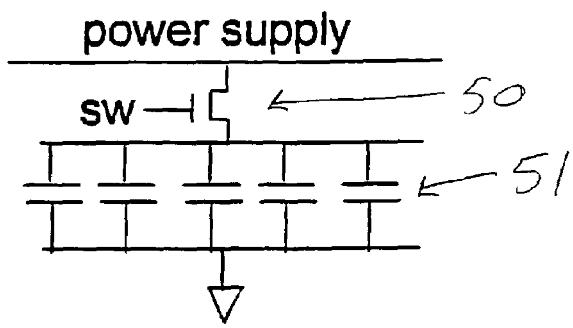
Fig-6,
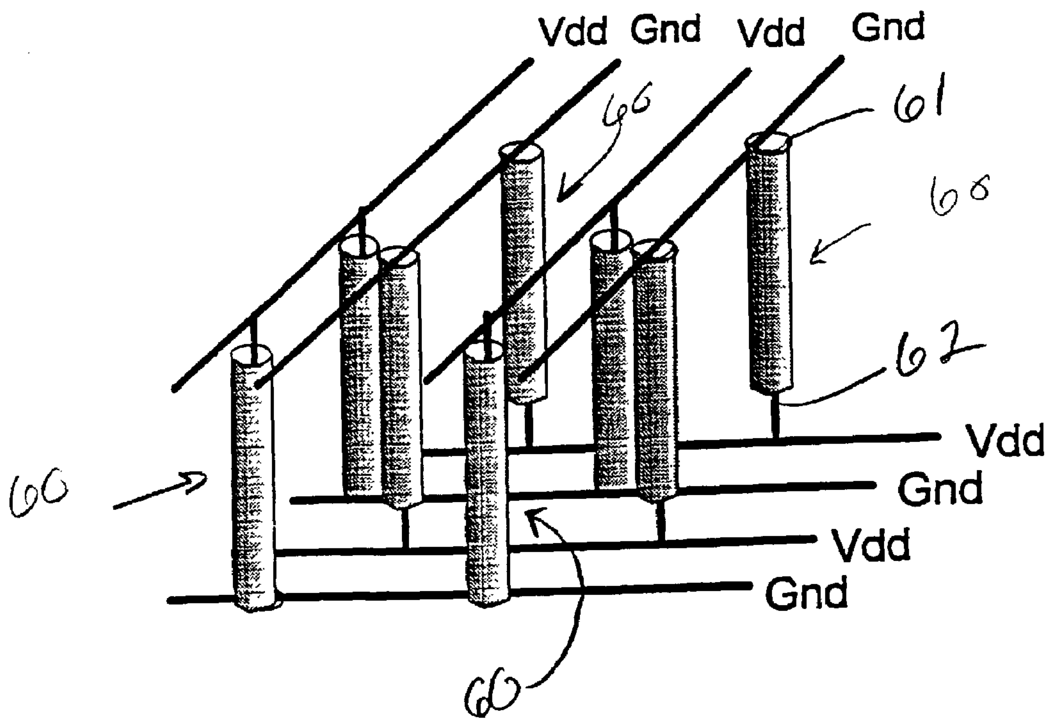
Fig-7
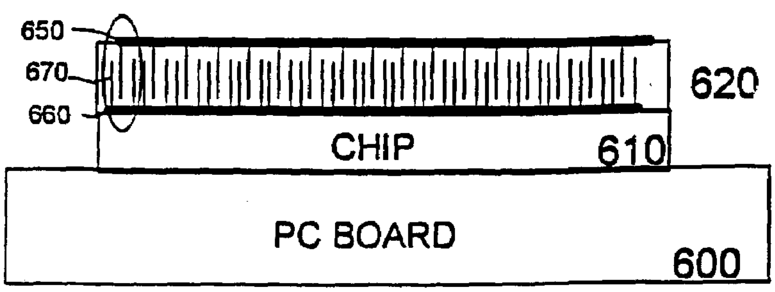

SHARED ON-CHIP DECOUPLING CAPACITOR AND HEAT-SINK DEVICES

BACKGROUND OF THE INVENTION

1. Field of the Invention

The present invention generally relates to heat dissipating elements and decoupling capacitors and more particularly to a structure that utilizes the decoupling capacitors as heat dissipating elements.

2. Description of the Related Art

Both decoupling capacitors and heat sinks are discrete devices conventionally added to a semiconductor chip at the packaging level. The decoupling capacitor is used to stabilize the supplied voltage levels, so that any noise spike can be damped or filtered away. The heat sink, on the other hand, is used to remove the heat generated by the chip and provides a large surface area. Over the years of technology advancements and process scaling, on-chip decoupling capacitors have been developed that use high-density capacitors such as deep-trench capacitors, stacked capacitors. Placing decoupling capacitors closer to the devices improves power stability. The decoupling capacitors which are placed closer to the devices suffer less voltage rippling effect due to increased filtering.

SUMMARY OF THE INVENTION

In view of the foregoing and other problems, disadvantages, and drawbacks of the conventional heat dissipating elements the present invention has been devised, and it is an object of the present invention to provide a structure of an improved heat dissipating element.

In order to attain the object(s) suggested above, there is provided, according to one aspect of the invention an integrated chip structure that has a substrate having a power supply, a chip attached to the substrate, at least two decoupling capacitors attached to the chip and to the power supply, and a control circuit adapted to select physical locations of active decoupling capacitors to be interspersed with inactive decoupling capacitors. The invention selectively connects and disconnects the decoupling capacitors to and from the power supply, such that the inactive decoupling capacitors provide a uniform heat dissipation function across the chip and the active decoupling capacitors provide a uniform power regulation function across the chip.

Temperature sensors are connected to the decoupling capacitors and the control circuit, and the control circuit is adapted to monitor a temperature of the decoupling capacitors through the temperature sensors. Switches are connected to the decoupling capacitors and are adapted to connect and disconnect the decoupling capacitor to and from the power supply, the switches are controlled by the control circuit. The control circuit is further adapted to disconnect a first decoupling capacitors from the power supply when the first decoupling capacitor exceeds a temperature limit.

The control circuit is adapted to connect a previously disconnected second decoupling capacitor to the power supply when the control circuit disconnects the first decoupling capacitor from the power supply. The decoupling capacitors are positioned on the chip to provide a required level of cooling and power regulation for all portions of the chip.

The process of the invention provides cooling and power regulation functions to an integrated circuit chip, by selectively connecting and disconnecting decoupling capacitors on the integrated circuit chip to and from a power supply so as to select physical locations of active decoupling capacitors and inactive decoupling capacitors such that the active decoupling capacitors are interspersed with inactive decoupling capacitors. The inactive decoupling capacitors provide a uniform heat dissipation function across the integrated circuit chip and the active decoupling capacitors provide a uniform power regulation function across the integrated circuit chip.

The process also selectively disconnects a first decoupling capacitor from the power supply when the first decoupling capacitor exceeds a temperature limit. The invention connects a previously disconnected second decoupling capacitor to the power supply when the control circuit disconnects the first decoupling capacitor from the power supply. The invention monitors temperature sensors associated with the decoupling capacitors. The process positions the decoupling capacitors on the integrated circuit chip to provide a required level of cooling and power regulation for all portions of the integrated circuit chip.

The invention combines an on-chip heat sink with an on-chip decoupling capacitor. The on-chip decoupling capacitor has a large surface area so it performs as an effective heat sink. The invention automatically switches the decoupling capacitor on and off based on a received control signal from an on-chip control circuit. When off, the decoupling capacitor acts as a heat sink. When on, the decoupling capacitor stabilizes voltage levels (power regulation). The invention also strategically distributes the decoupling capacitors. Therefore, switched-off decoupling capacitors will not affect the stability of the power supply, but can still be used as on-chip heat sinks so that chip temperature is well controlled. On the other hand, the positioning of switched-on decoupling capacitors would always be sufficient to stabilize the respective external power supplies or internally generated power levels. The invention uses a counter device to rotate the decoupling capacitors that are switched on and switched off from one area, to another area so that local heating effects will be avoided.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As mentioned above, discrete heat-sink components installed at the package level are a low-cost choice to remove heat from the chip. Integration of a heat-sink on a chip is more efficient, but discouraged, because there is no real estate to build the heat sink on the chip. After metallization, the chip surface is crowded with metal wiring, pads, and decoupling capacitors. Indeed, some designs use pads or wiring-to-wiring spaces for fabricating decoupling capacitors.

The invention combines an on-chip heat sink with an on-chip decoupling capacitor. The on-chip decoupling capacitor has a large surface area so it performs as an effective heat sink. The invention automatically switches the decoupling capacitor on and off based on a received control signal from an on-chip control circuit. When off, the decoupling capacitor acts as a heat sink. When on, the decoupling capacitor stabilizes voltage levels (power regulation). The invention also strategically distributes the decoupling capacitors. Therefore, switched-off decoupling capacitors will not affect the stability of the power supply, but can still be used as on-chip heat sinks so that chip temperature is well controlled. On the other hand, the positioning of switched-on decoupling capacitors would always be sufficient to stabilize the respective external power supplies or internally generated power levels. The invention uses a counter device to rotate the decoupling capacitors that are switched on and switched off from one area, to another area so that local heating effects will be avoided.

In general, devices (such as a capacitor) cannot be used as an effective heat sink device. This is because the devices themselves generate heat. A typical example is an on-chip heater made with a resistor having a proper resistivity. When a certain amount of current passes through the resistor, the surrounding temperature will rise due to the (joules) heat produced by the resistor. Similarly, other devices such as transistors, capacitors and inductors will all generate heat during active mode, and the heat must be effectively dissipated or the temperature on the chip will rise and eventually result in a thermal run-away and/or melt-down situation.

In order to make use of at least a portion of the decoupling capacitor as the on-chip heat-sink, that portion of the capacitor should be disconnected from the power supply (made inactive). Compared to other device components, the physical structure of capacitors allows them to be excellent heat-sinks due to their extended surface area. Thus, the invention shares hardware so that heat sinks can be fabricated on the chip without using extra real estate.

Figure 1:
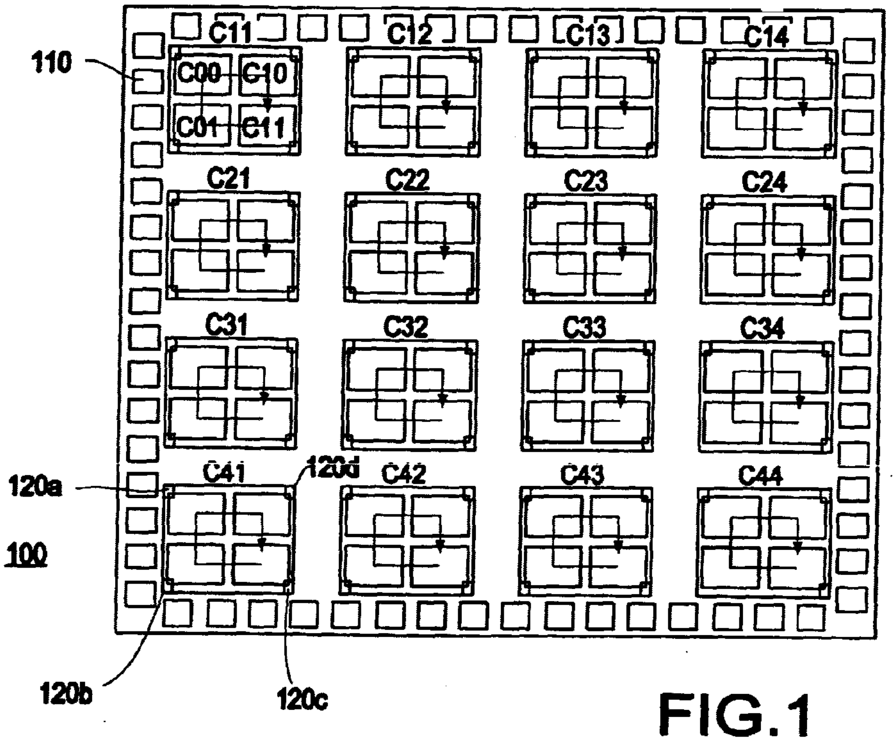
FIG. 1 is a schematic diagram of a semiconductor chip having a plurality of pads situated along the edges of the chip.

FIG. 1 shows an example of a semiconductor chip having a plurality of I/O (input/output) pads 110 situated along the edges of the chip. For illustration purpose, the rest of the chip is formed with arrays of decoupling capacitors (C11–C44). By grouping decoupling capacitors locally, the invention can rotatively switch on (or off) one of the decoupling capacitors with each group. For example, capacitor group C11 has four smaller capacitors, i.e. C00', C10', C01' and C11'. Here, each group of capacitors is equipped with four on-chip temperature sensors, 120A, 120B, 120C and 120*d* located at each corner.

The temperature sensors sense the surrounding temperature. When the temperature exceeds a certain level, a control signal will be sent to a control circuit to dictate switching on (or off) of one of the decoupling capacitors within each group. In this case, there will be a sufficient number of decoupling capacitors for the chip to regulate the voltage level, and also a sufficient heat-sink area to dissipate the heat away from the chip.

Figure 2:
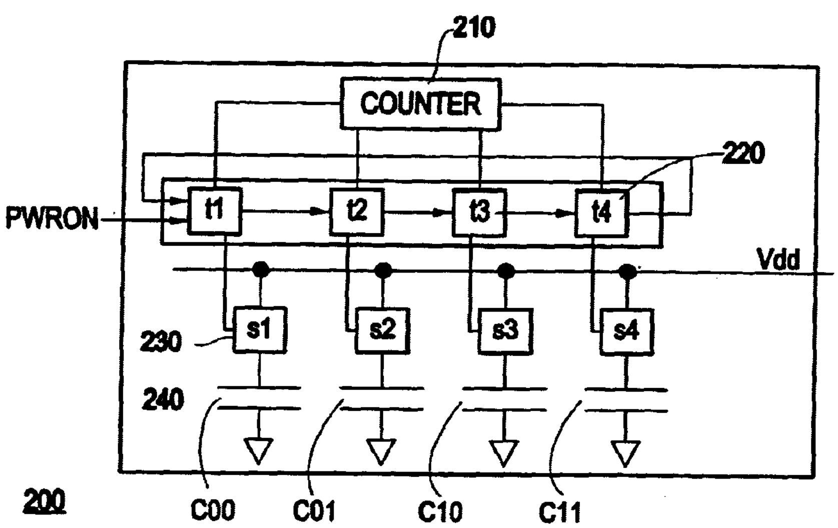
FIG. 2 is a schematic diagram of a control circuit for each group of the decoupling capacitors.

An example of the control circuit for each group of the decoupling capacitors is shown in FIG. 2. The control circuit comprises a ring counter 210, four temperature sensors 230 including T1, T2, T3 and T4, four switches S1, S2, S3 and S4, and four capacitors 240 including C00, C01, C10 and C11. While sets of four (e.g., four capacitors, four temperature sensors, etc.) are used in the examples, the invention is not limited to this number. Instead, the sets of devices with the invention could comprise any number of individual devices. Further, while these examples illustrate that the number of decoupling capacitors is equal in all sets and that the number of temperature sensors equals the number of capacitors, the invention is equally applicable to sets having many different numbers of devices and temperature sensors. The numbers selected in these examples are chosen for convenience of illustration only and are not intended to limit the applicability of the invention to other structures.

The switch will electrically disconnect (or connect) the decoupling capacitors from the power supply. When the decoupling capacitors is disconnected from the power supply, it is used as heat-sink. Based on the signals generated from the sensors, the ring counter rotates the switch from one to another to allow each of the decoupling capacitors to equally share in the heat dissipation and power smoothing roles.

Figures 3A, 3B:
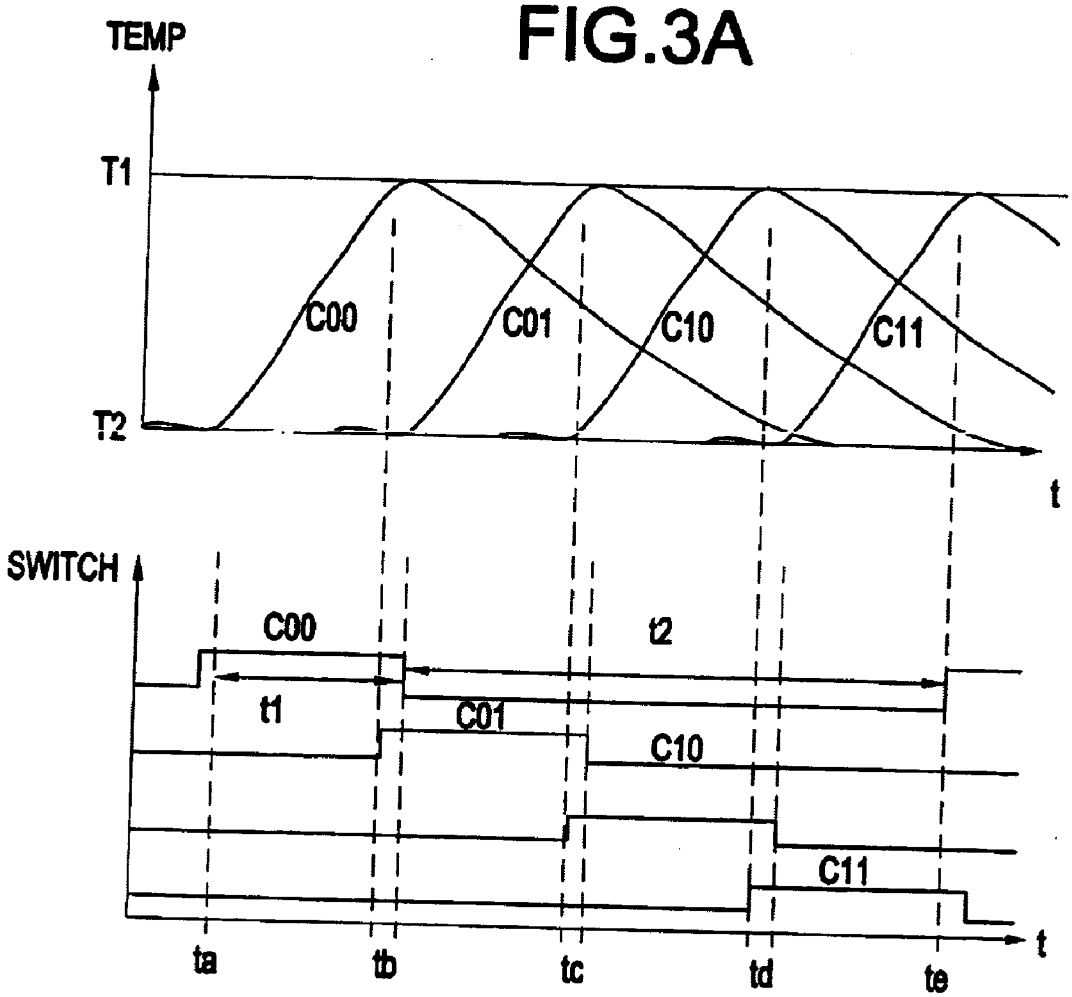
FIGS. 3A and 3B are diagrams showing the relationship between local temperature monitored by each sensor and the switching activity for each capacitor.

In one embodiment, the invention switches on only one decoupling capacitors at a time. This embodiment is useful if the chip has enough decoupling capacitors when only one (or a limited number) of the decoupling capacitors is used. Therefore, with this embodiment only one of the decoupling capacitors out of the decoupling capacitor group is switched on to be used as the decoupling capacitors for the chip. The temperature diagrams in FIGS. 3A–3B show the relationship between local temperature monitored by each sensor and the switching activity for each capacitor.

For example, the system starts with all capacitors in an inactive state. After capacitor C00 is switched on (at time Ta), its temperature begins to rise. When the temperature around the capacitor C00 reaches a preset temperature limit T1 at time Tb, it is switched off after the inactive capacitor C01 is switched on. More specifically, FIG. 3A illustrates the heating and cooling of the decoupling capacitors as they are turned on and off. FIG. 3B illustrates the signals supplied to each decoupling capacitor to turn them on or off. A period of overlap insures that, at any time, at least one decoupling capacitor is on per group of decoupling capacitors to serve as a power smoothing element. For example, the first decoupling capacitor C00 is turned on during t1 and turned off during t2. Before, C00 is turned off, C01 is turned on so that at any moment, there is always a sufficient number of decoupling capacitors active to guard the voltage levels. This process continues and rotates through the different decoupling capacitors, so that only one (or a limited number) of the decoupling capacitors is on at any given time (except for a slight overlap) and so that all the decoupling capacitors share in the power regulation and heat dissipation functions.

Figures 4A, 4B:
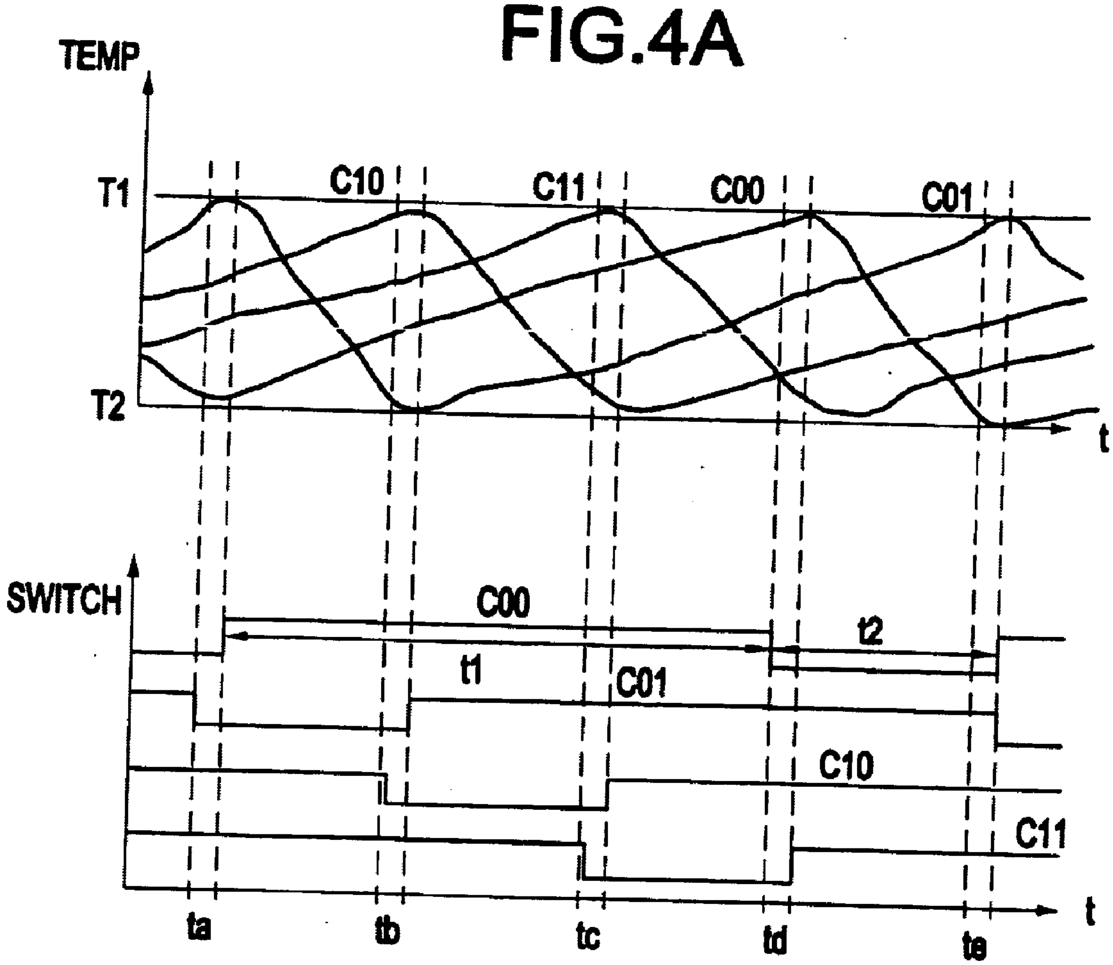
FIGS. 4A and 4B are diagrams showing the relationship between local temperature monitored by each sensor and the switching activity for each capacitor.

In another embodiment only one decoupling capacitors is switched off at a given time. This is useful when enough heat dissipation occurs even if as little as one (or a limited number) of the capacitors in a group is off. Therefore, with this embodiment, only one capacitor is switched off to serve as the heat sink element to cool the chip. The temperature diagrams shown in FIGS. 4A–4B show the relationship between local temperature monitored by each sensor and the switching activity for each capacitor. For example, the system starts with three active capacitors C01, C10 and C11. When the temperature around the capacitor C01 reaches a preset limit T1, it is switched off before the inactive capacitor C00 is switched on. More specifically, FIG. 4A illustrates the heating and cooling of the decoupling capacitors as they are turned on and off. FIG. 4B illustrates the signals supplied to each decoupling capacitor to turn them on or off. A period of overlap insures that, at any time, at least one decoupling capacitor is off per group of decoupling capacitors to serve as a heat-sink element.

Figure 5:
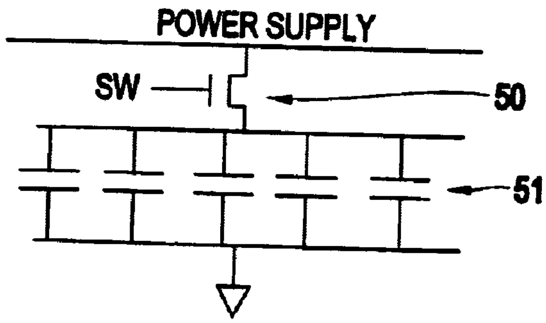
FIG. 5 is a schematic diagram of a capacitor sub-group comprising a switch device and a plurality of capacitors.

An example circuit diagram of a capacitor sub-group comprising a switch device 50 and a plurality of capacitors 51 is depicted in FIG. 5. Here, the capacitors 51 are connected in parallel with the first common node tied to a virtual power supply, and the other common node tied to ground. When the switch 50 is turned on, the virtual power supply will be shorted to the real power supply, and the capacitors are used as decoupling capacitors. When the switch 50 is turned off, the virtual power supply line becomes floating, or may be shorted to ground, so that the capacitor structure can be used as a heat sink.

Figure 6:
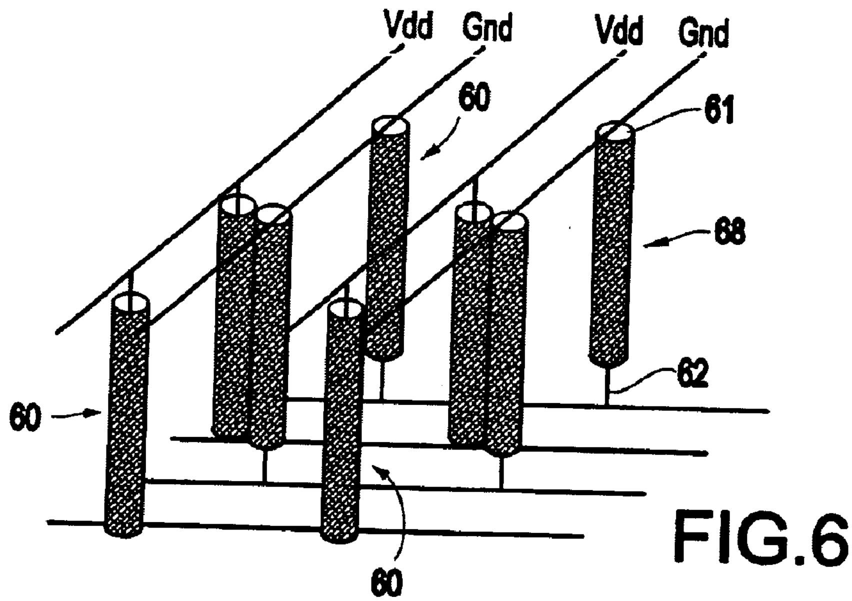
FIG. 6 is a perspective view schematic conceptual diagram using deep trench capacitors.

A three-dimensional conceptual diagram using deep trench capacitors 60 is shown in FIG. 6. With this structure, both nodes of the decoupling capacitors 60 are allowed to emerge to the surface so that heat can be effectively conducted and removed from the surface. Each deep trench capacitor 60 is formed by a first node 61, the shell, that is connected to the ground bus, and a second node 62, the core that is connected to a power bus. When the trench cap is disconnected from the power supply during the heat sink mode, its layer surface area helps dissipate the heat away.

In semiconductor chips, metal wirings usually traverse in parallel within the same level. For example, in the first metal level, all the power lines, (e.g., Vdd and ground) are running in one direction. In the second metal level, they are running in another orthogonal direction. The reason for running the lines orthogonally is to reduce noise coupling between any two adjacent levels of signal wirings. The invention uses at least two orthogonal wirings at two metal levels (e.g., M1 and M4) to form deep trench decoupling capacitors, so that one node of the decoupling capacitors is always allowed to surface for better thermal conductivity. Increasing the surface area exposed to the air enhances heat dissipation. In addition, if the media surrounding the decoupling capacitor has a high thermal conductivity, this would also help remove the heat.

Figure 7:
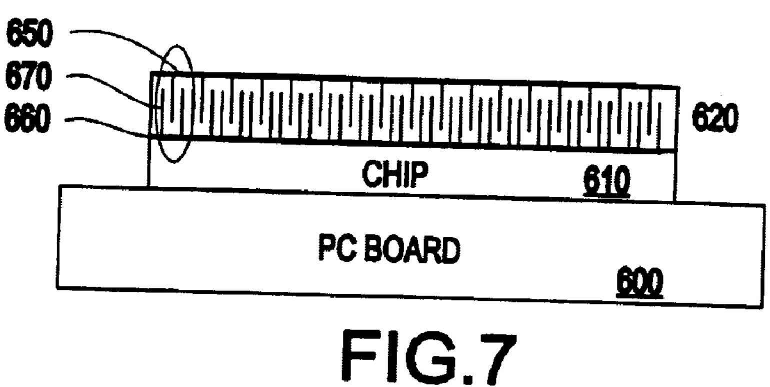
FIG. 7 is a schematic diagram of configurations of shared decoupling capacitors/heat-sink devices fabricated on a chip.
Figure 8:
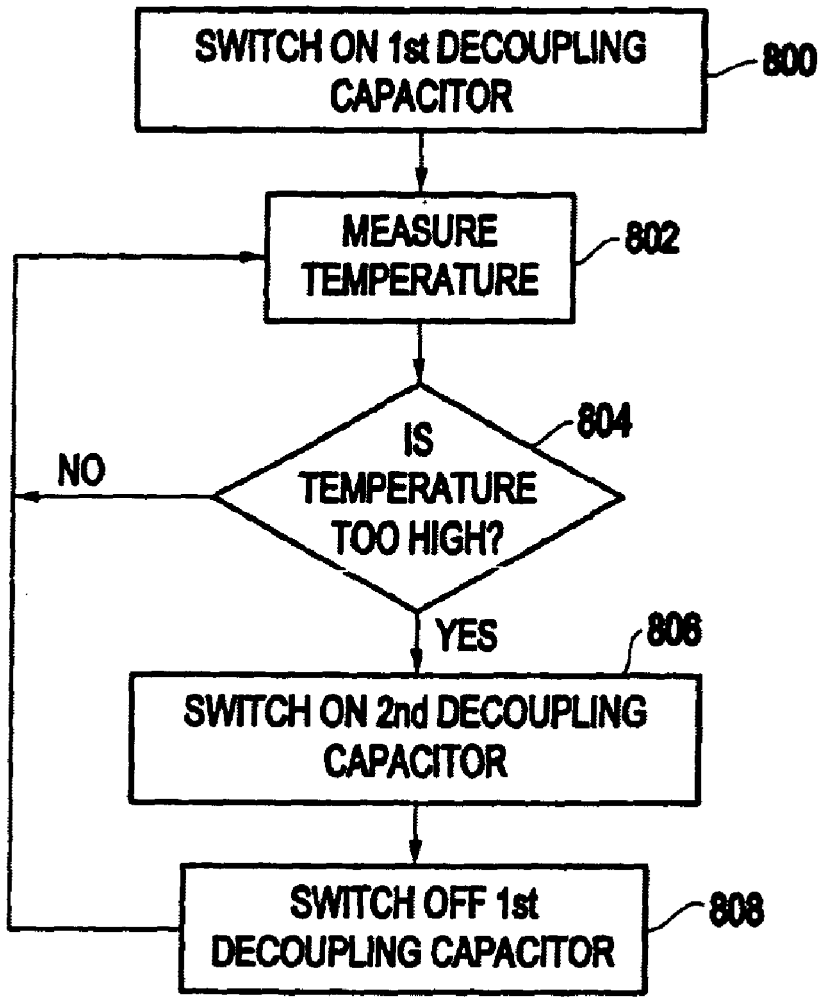

Based on the same principle, in FIG. 7, one configuration of such a shared decoupling capacitor/heat-sink device is shown fabricated on a chip. The configuration (FIG. 7) shows a chip 610 is mounted on a board 600 having a first kind of decoupling capacitor layer 620 formed on top of the chip 610. The decoupling capacitor layer 620 comprises a plurality of decoupling capacitor devices with a first common node 660 connected to the devices of the chip, and a second common node 650 exposed. Items 670 are fins that either connect to 650 or 660 to form a decoupling capacitor and heat sink. At any moment, a portion of decoupling capacitor layer 620 is used as a heat sink for thermal dissipation, and the other portion is used as a decoupling capacitor to regulate the power supplies for the chip.

In addition cooling structures may be attached to or formed as part of the decoupling capacitors. The cooling structures increase the surface area of the decoupling capacitors and can comprise fins, a corrugated or roughened surface, liquid or gas cooled channels, thermoelectric coolers, etc. The cooling structures could be included in any embodiment of the invention.

Figure 8:
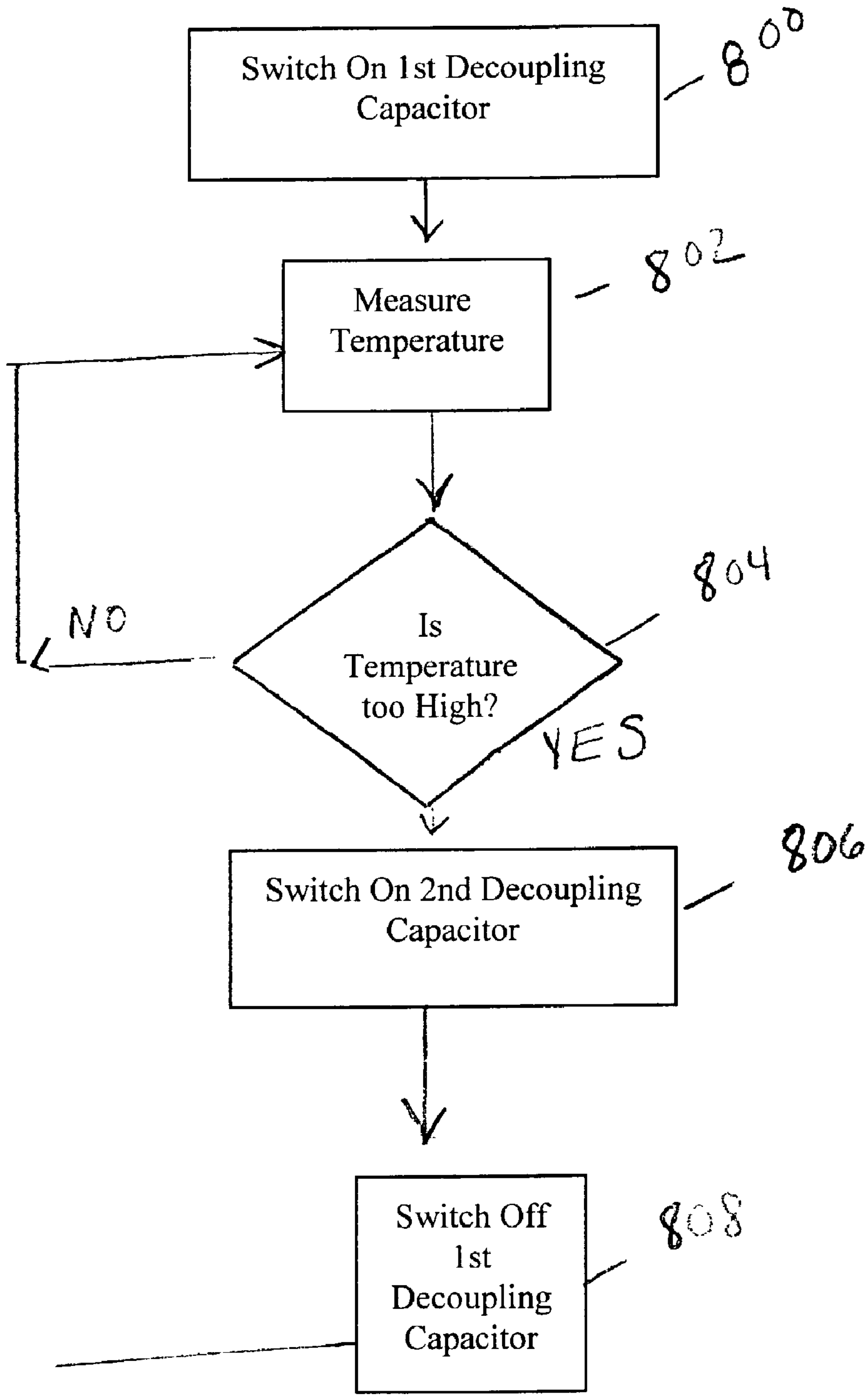
FIG. 8 is a flowchart illustrating one embodiment of the invention.

FIG. 8 is a flowchart which shows the invention in flowchart form. First in item 800, the invention switches on the first decoupling capacitor. Next in item 802, the invention measures the temperature. If the temperature is too high, as decided in item 804, the invention proceeds to item 806 and switches on the second decoupling capacitor. The invention then proceeds to item 808 and switches off the first decoupling capacitor. If the temperature is not too high in item 804, the invention returns to item 802 and continues to monitor the temperature of the first decoupling capacitor.

The invention combines an on-chip heat sink with an on-chip decoupling capacitor which decreases the size and cost of the chip. The on-chip decoupling capacitor has a large surface area so it performs as an effective heat sink. The invention automatically switches the decoupling capacitor on and off based on a received control signal from an on-chip control circuit. When off, the decoupling capacitor acts as a heat sink. When on, the decoupling capacitor stabilizes voltage levels (power regulation). The invention also strategically distributes the decoupling capacitors. Therefore, switched-off decoupling capacitors will not affect the stability of the power supply, but can still be used as on-chip heat sinks so that chip temperature is well controlled. On the other hand, the positioning of switched-on decoupling capacitors would always be sufficient to stabilize the respective external power supplies or internally generated power levels. The invention uses a counter device to rotate the decoupling capacitors that are switched on and switched off from one area, to another area so that local heating effects will be avoided.

While the invention has been described in terms of preferred embodiments, those skilled in the art will recognize that the invention can be practiced with modification within the spirit and scope of the appended claims.

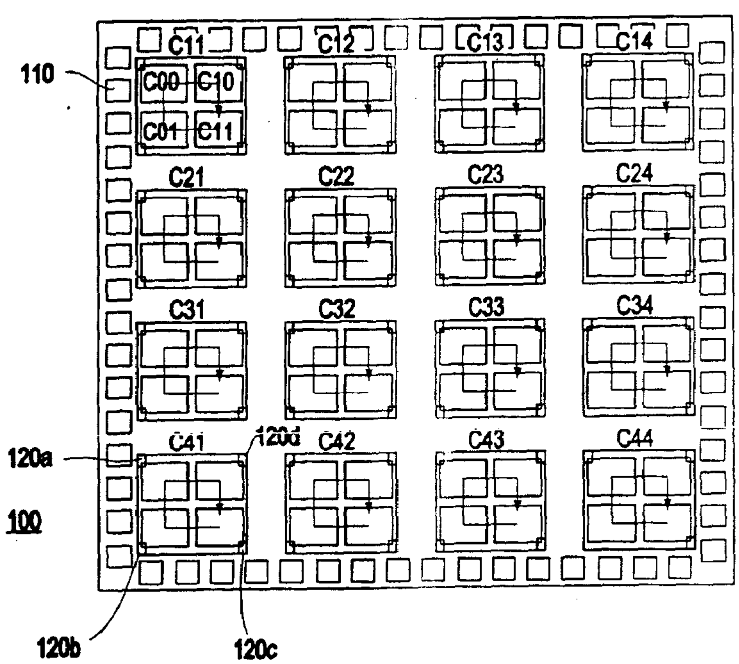

What is claimed is:

1. An integrated circuit structure comprising:

a substrate having a power supply;

a chip attached to said substrate;

at least two decoupling capacitors on said chip and attached to said power supply; and a control circuit adapted to electrically disconnect said decoupling capacitors from said power supply such that, when disconnected, said decoupling capacitors dissipate heat from said chip by thermal conduction.

2. The integrated circuit in claim 1, further comprising temperature sensors connected to said decoupling capacitors and said control circuit, wherein said control circuit is adapted to monitor a temperature around said decoupling capacitors through said temperature sensors.

3. The integrated circuit in claim 1, further comprising switches connected to said decoupling capacitors and being adapted to connect and disconnect said decoupling capacitor to and from said power supply, wherein said switches are controlled by said control circuit.

4. The integrated circuit in claim 1, wherein said control circuit is further adapted to disconnect a first decoupling capacitor from said power supply when a temperature around said first decoupling capacitor exceeds a temperature limit.

5. The integrated circuit in claim 4, where said control circuit is further adapted to connect a previously disconnected second decoupling capacitor to said power supply when said control circuit disconnects said first decoupling capacitor from said power supply.

6. The integrated circuit in claim 1, wherein said decoupling capacitors are positioned on said chip to simultaneously provide a required level of cooling and power regulation for all portions of said chip.

7. An integrated chip structure comprising:
- a substrate having a power supply;
- a chip attached to said substrate;
- at least two decoupling capacitors on said chip and attached to said power supply; and
- a control circuit adapted to rotate said decoupling capacitors from active status for power regulation to inactive status for heat dissipation by thermal conduction in a balanced manner across said chip by selectively connecting and disconnecting said decoupling capacitors to and from said power supply.

8. The integrated circuit in claim 7, further comprising temperature sensors connected to said decoupling capacitors and said control circuit, wherein said control circuit is adapted to monitor a temperature around said decoupling capacitors through said temperature sensors.

9. The integrated circuit in claim 7, further comprising switches connected to said decoupling capacitors and being adapted to connect and disconnect said decoupling capacitor to and from said power supply, wherein said switches are controlled by said control circuit.

10. The integrated circuit in claim 7, wherein said control circuit is further adapted to disconnect a first decoupling capacitor from said power supply when a temperature around said first decoupling capacitor exceeds a temperature limit.

11. The integrated circuit in claim 10, wherein said control circuit is further adapted to connect a previously disconnected second decoupling capacitor to said power supply when said control circuit disconnects said first decoupling capacitor from said power supply.

12. The integrated circuit in claim 7, wherein said decoupling capacitors are positioned on said chip to simultaneously provide a required level of cooling and power regulation for all portions of said chip.

13. An integrated chip structure comprising:
- a substrate having a power supply;
- a chip attached to said substrate,
- at least two decoupling capacitors on said chip and attached to said power supply, and
- a control circuit adapted to select physical locations of active decoupling capacitors to be interspersed with inactive decoupling capacitors, by selectively connecting and disconnecting said decoupling capacitors to and from said power supply, such that said inactive decoupling capacitors provide a uniform heat dissipation function by thermal conduction across said chip and said active decoupling capacitors provide a uniform power regulation function across said chip.

14. The integrated circuit in claim 13, further comprising temperature sensors connected to said decoupling capacitors and said control circuit, wherein said control circuit is adapted to monitor a temperature around said decoupling capacitors through said temperature sensors.

15. The integrated circuit in claim 13, further comprising switches connected to said decoupling capacitors and being adapted to connect and disconnect said decoupling capacitors to and from said power supply, wherein said switches are controlled by said control circuit.

16. The integrated circuit in claim 13, wherein said control circuit is further adapted to disconnect a first decoupling capacitor from said power supply when a temperature around said first decoupling capacitor exceeds a temperature limit.

17. The integrated circuit in claim 16, where said control circuit is further adapted to connect a previously disconnected second decoupling capacitor to said power supply when said control circuit disconnects said first decoupling capacitor from said power supply.

18. The integrated circuit in claim 13, wherein said decoupling capacitors are positioned on said chip to simultaneously provide a required level of cooling and power regulation for all portions of said chip.

19. A method of providing cooling and power regulation functions to an integrated circuit chip, said method comprising:
- forming at least two decoupling capacitors on said integrated circuit chip;
- electrically disconnecting said decoupling capacitors from a power source such that, when disconnected, said decoupling capacitors dissipate heat by thermal conduction from said integrated circuit chip; and
- electrically connecting said decoupling capacitors to said power source such that, when connected, said decoupling capacitors regulate power supplied to said integrated circuit chip.

20. The method in claim 19, wherein said electrically disconnecting process disconnects a first decoupling capacitor from said power supply when a temperature around said first decoupling capacitor exceeds a temperature limit.

21. The method in claim 20, wherein said electrically disconnecting process connects a previously disconnected second decoupling capacitor to said power supply when said control circuit disconnects said first decoupling capacitor from said power supply.

22. The method in claim 19, wherein said electrically disconnecting process includes monitoring temperature sensors associated with said decoupling capacitors.

23. The method in claim 19, further comprising positioning said decoupling capacitors on said integrated circuit chip to simultaneously provide a required level of cooling and power regulation for all portions of said integrated circuit chip.

24. The method in claim 19, wherein said electrically connecting and said electrically disconnecting comprises activating and deactivating switches on said integrated circuit chip.

25. A method of providing coating and power regulation functions to an integrated circuit chip, said method comprising forming at least two decoupling capacitors on said integrated circuit chip; and, rotating said decoupling capacitors an said integrated circuit chip from active status for power regulation to inactive status for heat dissipation by thermal conduction in a balanced manner across said integrated circuit integrated circuit chip by selectively connecting and disconnecting said decoupling capacitors to and from a power supply.

26. The method in claim 25, wherein said method includes electrically disconnecting a first decoupling capacitor from said power supply when a temperature around said first decoupling capacitor exceeds a temperature limit.

27. The method in claim 26, wherein said method includes connecting a previously disconnected second decoupling capacitor to said power supply when said control circuit disconnects said first decoupling capacitor from said power supply.

28. The method in claim 25, wherein said method includes monitoring temperature sensors associated with said decoupling capacitors.

29. The method in claim 25, wherein said method includes positioning said decoupling capacitors on said integrated circuit chip to simultaneously provide a required level of cooling and power regulation for all portions of said integrated circuit chip.

30. The method in claim 25, wherein said method includes activating and deactivating switches on said integrated circuit chip to connect and disconnect said decoupling capacitors to and from said power supply.

31. A method providing cooling and power regulation functions to an integrated circuit chip, said method comprising:

forming at least two decoupling capacitors on said integrated circuit chip; selectively connecting and disconnecting said decoupling capacitors on said integrated circuit chip to and from a power supply so as to select physical locations of active decoupling capacitors and inactive decoupling capacitors such that said active decoupling capacitors are interspersed with inactive decoupling capacitors, wherein said inactive decoupling capacitors provide a uniform heat dissipation function by thermal conduction across said integrated circuit chip and said active decoupling capacitors provide a uniform power regulation function across said integrated circuit chip.

32. The method in claim 31, wherein said selectively connecting and disconnecting process disconnects a first decoupling capacitor from said power supply when a temperature around said first decoupling capacitor exceeds a temperature limit.

33. The method in claim 32, wherein said selectively connecting and disconnecting process connects a previously disconnected second decoupling capacitor to said power supply when said control circuit disconnects said first decoupling capacitor from said power supply.

34. The method in claim 31, wherein said selectively connecting and disconnecting process includes monitoring temperature sensors associated with said decoupling capacitors.

35. The method in claim 31, further comprising positioning said decoupling capacitors on said integrated circuit chip to simultaneously provide a required level of cooling and power regulation for all portions of said integrated circuit chip.

36. The method in claim 31, wherein said selectively connecting and disconnecting process comprises activating and deactivating switches on said integrated circuit chip.

* * * * *

UNITED STATES PATENT AND TRADEMARK OFFICE

CERTIFICATE OF CORRECTION

PATENT NO. : 6,967,416 B2

DATED : November 22, 2005

INVENTOR(S) : Clevenger et al.

It is certified that error appears in the above-identified patent and that said Letters Patent is hereby corrected as shown below:

The Title page showing an illustrative figure should be deleted, and substitute therefore the attached title page consisting of Fig. 1.

The drawing sheets 1-6 consisting of figs. 1-8 should be deleted and substitute therefore the attached drawing sheets consisting of Figs. 1-8.

Signed and Sealed this

Twenty-eighth Day of February, 2006

JON W. DUDAS

*Director of the United States Patent and Trademark Office*

(12) United States Patent
Clevenger et al.

(10) Patent No.: US 6,967,416 B2
(45) Date of Patent: Nov. 22, 2005

(54) SHARED ON-CHIP DECOUPLING CAPACITOR AND HEAT-SINK DEVICES

(75) Inventors: Lawrence A. Clevenger, LaGrangeville, NY (US); Amy R. Hsu, Fishkill, NY (US); Louis L. Hsu, Fishkill, NY (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 482 days.

(21) Appl. No.: 10/193,641

(22) Filed: Jul. 11, 2002

(65) Prior Publication Data

US 2004/0007918 A1 Jan. 15, 2004

(51) Int. Cl.$^{7}$ .............................................. H01H 35/00
(52) U.S. Cl. ........................ 307/117; 307/112; 307/116
(58) Field of Search ........................ 307/112, 116, 117, 307/109; 361/93.8, 103, 106

(56) References Cited

U.S. PATENT DOCUMENTS 5,103,283 A * 4/1992 Hite .......................... 257/724
5,568,423 A * 10/1996 Jou et al. ............... 365/185.33
5,694,297 A * 12/1997 Smith et al. ................ 361/785
6,115,270 A * 9/2000 Yamane et al. ............... 363/40
6,424,058 B1 * 7/2002 Frech et al. ................ 307/109
2001/0050408 A1 * 12/2001 Bernstein et al.

* cited by examiner

*Primary Examiner*—Robert L. Deberadinis

(74) *Attorney, Agent, or Firm*—McGinn & Gibb, PLLC; Marian Underweiser

(57) ABSTRACT

A method and structure for an integrated chip structure comprises a substrate having a power supply, a chip attached to the substrate, at least two decoupling capacitors attached to the chip and to the power supply, and a control circuit adapted to select physical locations of active decoupling capacitors to be interspersed with inactive decoupling capacitors. The invention selectively connects and disconnects the decoupling capacitors to and from the power supply, such that the inactive decoupling capacitors provide a uniform heat dissipation function across the chip and the active decoupling capacitors provide a uniform power regulation function across the chip.

36 Claims, 6 Drawing Sheets